United States Patent [19]

Platzer

[11] Patent Number: 5,725,988
[45] Date of Patent: Mar. 10, 1998

[54] SOLID TRANSFER NEGATIVE- OR POSITIVE-WORKING COLOR PROOFING ELEMENT

[75] Inventor: Stephan J. W. Platzer, Califon, N.J.

[73] Assignee: Bayer Corporation, Pittsburgh, Pa.

[21] Appl. No.: 163,214

[22] Filed: Dec. 7, 1993

Related U.S. Application Data

[62] Division of Ser. No. 881,442, May 11, 1992, which is a continuation of Ser. No. 261,374, Oct. 21, 1988, Pat. No. 5,213,941.

[51] Int. Cl.⁶ .......................... G03C 1/805; G03C 11/12
[52] U.S. Cl. .................... 430/162; 430/143; 430/166; 430/257; 430/260; 430/262
[58] Field of Search ........................ 430/162, 262, 430/258, 260, 271, 166, 257

[56] References Cited

U.S. PATENT DOCUMENTS

| | | | |
|---|---|---|---|
| 4,053,313 | 10/1977 | Fan | 96/36 |
| 4,650,738 | 3/1987 | Platzer et al. | 430/143 |
| 4,659,642 | 4/1987 | Platzer et al. | 430/143 |
| 4,756,988 | 7/1988 | Kausch et al. | 430/271 |
| 4,762,766 | 8/1988 | Melbye | 430/156 |

FOREIGN PATENT DOCUMENTS 0 277 038  3/1988  European Pat. Off. .

*Primary Examiner*—John S. Chu
*Attorney, Agent, or Firm*—Roberts & Mercant

[57] ABSTRACT

This invention provides an improved negative-working or positive-working, single sheet color proofing method which can accurately reproduce images by using colored, photosensitive layers on substrates which are then overcoated with partially developable adhesive layers. The final construction is useful in predicting the image quality from a lithographic printing process. The partial removal of the adhesive layers cleans out any background stain which may remain from the incomplete removal of the photosensitive layer.

13 Claims, No Drawings

SOLID TRANSFER NEGATIVE- OR POSITIVE-WORKING COLOR PROOFING ELEMENT

This is a divisional of application Ser. No. 07/881,442 filed May 11, 1992, which is a continuation of Ser. No. 07/261,374 filed Oct. 21, 1988, U.S. Pat. No. 5,213,941 granted May 25, 1993.

BACKGROUND OF THE INVENTION

In the graphic arts, it is desirable to produce a three or more color proof to assist in correcting a set of Color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. However, this conventional method of color proofing is costly and time consuming.

Photoimaging processes can also be used to produce color proofs. There are two general types of photoimaging methods; namely the overlay type and the single sheet type.

In the overlay type color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films onto a single receiver sheet. This is done by utilizing a single opaque support and by applying toners, transferring images, or processing solutions or coatings of photosensitive materials of corresponding colors on the opaque support in succession. An advantage of the single sheet type of color proof is that the color saturation is not influenced by superimposed plastic supports. This method more closely resembles the actual printing process and eliminates the color distortion inherent in the overlay system.

The present invention relates to improved negative-working and positive-working proofing sheets of the single sheet, solid layer transfer class. Color proofing films of this type are composed of a sheet substrate, a colored photosensitive layer on the sheet, and an adhesive layer disposed on the photosensitive layer.

An example of a negative-working, single sheet approach is described in U.S. Pat. No. 3,671,236. The presensitized element comprises a substrate having a release surface, a pigmented photosensitive layer in contact with the release surface, a pressure sensitive adhesive layer, and a barrier layer between the photosensitive layer and the adhesive layer. The primary function of the barrier layer is to prevent pigment staining on the adhesive during development. The element is used by laminating it to a receiver via the adhesive layer. The substrate is removed, the photosensitive layer is exposed, and the material is processed in a solvent medium. These steps are generally repeated three times to produce a multicolored proof.

An example of a positive-working, single sheet approach is given in U.S. Pat. No. 4,260,673. The presensitized element comprises a substrate having a release surface, a pigmented photosensitive layer in contact with the release surface, a heat sensitive adhesive layer, and a binder layer between the pigmented layer and the adhesive layer. The binder layer comprises a photosensitive compound and prevents pigment staining of the adhesive. The element is processed like the negative-working element in U.S. Pat. No. 3,671,236.

Examples of negative-working and positive-working, single sheet approaches without preventative layers between the photosensitive and adhesive layers are described in U.S. Pat. Nos. 4,650,738 and 4,659,642, respectively. The presensitized elements comprise a sheet having a release surface, a colored photosensitive layer in contact with the release surface, and an adhesive layer directly adhered to said colored layer. The adhesive layer comprises a vinyl acetate polymer.

This invention provides an improved photosensitive element which provides an adhesive layer which is partially removable by the liquid developer. In this manner the uppermost part of the adhesive layer is removed so that the layer retains its adhesive property but any residual photosensitive layer which causes background staining is removed.

SUMMARY OF THE INVENTION

The present invention provides an improved photosensitive element and method for forming a colored image which comprises:

A. providing a photosensitive element which comprises, in order:

i) a substrate having a release surface; and ii) a single, colored photosensitive layer on said release surface, which photosensitive layer comprises a light sensitive, negative-working diazonium salt or positive-working naphthoquinone diazide compound in an amount sufficient to photosensitize the layer; a resinous binder composition in an amount sufficient to bind the layer components into a uniform film, which composition contains a major amount of at least one resin selected from the group consisting of a vinyl acetal polymer and a styrene/maleic anhydride copolymer half ester; and at least one colorant in an amount sufficient to uniformly color the layer; and iii) a nonphotosensitive adhesive layer in direct contact with said photosensitive layer, which adhesive layer comprises a major amount of one or more thermoplastic polymers, is partially soluble in the developer, is nontacky at room temperature, and can be transferred at temperatures between 60° C. and 180° C.; and B. either i) laminating said element with heat and pressure via said adhesive layer to a developer resistant receiver sheet;

and removing said substrate by the application of peeling forces; and imagewise exposing said photosensitive layer to actinic radiation; or ii) imagewise exposing said photosensitive layer to actinic radiation; and laminating said element with heat and pressure via said adhesive layer to a developer resistant receiver sheet; and removing said substrate by the application of peeling forces; or iii) laminating said element with heat and pressure via said adhesive layer to a developer resistant receiver sheet; and imagewise exposing said photosensitive layer to actinic radiation; and removing said substrate by the application of peeling forces; and C. removing the nonimage areas of said photosensitive layer and some of the said adhesive layer with a liquid developer, which removing is conducted at a temperature at which said adhesive layer is substantially nontacky; and D. preferably repeating steps A through C at least once whereby another photosensitive element having at least one different colorant is laminated onto said receptor sheet over the nonremoved portions of the previously laminated and processed photosensitive layer or layers.

DETAILED DESCRIPTION OF THE PREFERRED EMBODIMENT

In the production of the color proofing film of this invention, one provides a photosensitive element which broadly comprises a substrate having a release surface, a colored photosensitive layer on the release surface, and an adhesive layer on the photosensitive layer. It is preferred that the substrate is composed of a dimensionally and chemically stable base material which does not significantly change its size, shape, or chemical properties as the result of the heating, coating, or other treatments which it must undergo. One especially preferred material is polyethylene terephthalate. In the usual case, it has a thickness of from about 1 to about 10 mils, a more preferred thickness is from about 2 to about 5 mils, and most preferably from about 2 to about 3 mils. Suitable films include Hostaphan 3000 available from Hoechst Celanese Corporation, Mylar D available from DuPont, and Melinex 516 available from ICI. The surface of the substrate may be smooth or may be provided with a matte texture by various methods known in the art.

Matte films include Melinex 377 and 470 from ICI. These materials have the unique property of giving the final image a desired matte finish without any extra steps. One can control the gloss of the final image by properly selecting the matte finish of the temporary support. This effect works because the top layer of the final image is originally in contact with this matte surface. An additional advantage of coating on a matte surface is that subsequent transferred layers generally adhere better to a rough surface than to a smooth surface.

A similar matte finish of the final image can be obtained by embossing the top surface of the image with a matte material, such as described above. This is done by laminating together the final image and matte material with heat and pressure. The matte material is then generally removed after lamination. The advantage of this method is that the finish of the final proof can be varied. Furthermore, the matting material can be used repeatedly.

Another method for producing a matte finish uses a heat transferable layer, such as Butvar 90 available from Monsanto, coated onto a film with a rough surface, such as Melinex 329 available from ICI. The transferable layer is laminated to the final image with heat and pressure. Then the film with the rough surface is peeled off. The rough surface of the transferred layer imparts a matte finish to the final image. An additional advantage is that the extra transferred layer protects the image. U.S. Pat. Nos. 4,294,909 and 4,376,159 also suggest various methods for making a matte surface. The substrate must have a release surface, that is, it must be capable of releasably holding the photosensitive layer thereto. This may be accomplished by the substrate surface being either inherently releasable, rendered releasable by a suitable treatment, or provided with a release layer over the substrate surface. Such a release layer may comprise polyvinyl alcohol.

Releasably bonded to the release surface is the photosensitive layer. The photosensitive layer broadly comprises a photosensitizer, a colorant, a binding resin, and other optional ingredients such as plasticizers, acid stabilizers, surfactants, antistatic compositions, uv absorbers, optical brighteners, inert fillers, and residual coating solvents.

The preferred negative-working photosensitizer is a light sensitive, polymeric diazonium salt. The most preferred photosensitizer is the polycondensation product of 3-methoxy-4-diazo-diphenylamine sulfate and 4,4'-bis-methoxymethyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

The preferred positive-working photosensitizer is a light sensitive, naphthoquinone diazide. The most preferred photosensitizer is the ester of bis-(3-benzoyl-4,5,6-trihydroxy phenyl)-methane and 2-diazo-1-naphthol-5-sulfonic acid as taught in U.S. Pat. No. 4,407,926. Other suitable photosensitizers are taught in U.S. Pat. Nos. 3,106,365; 3,148,983; 3,201,239; and 4,266,001. The diazo compounds of choice are preferably soluble in organic solvents.

Suitable binding resins for the photosensitive layer include polyvinyl butyral, styrene maleic anhydride copolymer half esters, and mixtures thereof. Such resins include Butvar B72, B76 and B90, and Scripset 540 and 550, all available from Monsanto. An important resin selection criterion is that it must be a good film former.

The colorants useful for the present invention include various classes of dyes and pigments. Preferred colorants for this invention are pigments rather than dyes. In the most preferred embodiment, pigments having an average particle size of about 1 micrometer or less are used. Nonexclusive examples of pigments usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

Optional plasticizers which may be incorporated into the photosensitive layer include those of the phthalate and phosphate types. Preferred plasticizers include dibutyl phthalate and dimethyl phthalate. Acid stabilizers include phosphoric acid and p-toluene sulfonic acid.

The photosensitive layer ingredients may be blended with such compatible solvents as ethanol, methyl cellosolve, gamma butyrolactone, propylene glycol monomethyl ether, and methyl ethyl ketone. The solution is then coated on the release surface of the substrate. The photosensitive layer has a preferred coating weight of between approximately 0.1 and 5.0 g/m². The most preferred weight is from about 0.5 to 2.0 g/m².

In the preferred embodiment, the photosensitizer is present in the photosensitive layer in an amount of from about 5 to about 70 percent by weight; or more preferably from about 10 to about 50 percent by weight.

In the preferred embodiment, the colorant is present in the photosensitive layer in an amount of from about 5 to about 50 percent by weight; or more preferably from about 10 to about 40 percent by weight.

In the preferred embodiment, the binding resin is present in the photosensitive layer in an amount of from about 10 to about 80 parts by weight; or more preferably from about 20 to about 70 parts by weight.

|  | Cyan | Yellow | Magenta | Black |
|---|---|---|---|---|
| Typical formulations by weight for the negative-working photosensitive layer includes: | | | | |
| methyl cellosolve | 41.00 | 41.00 | 46.50 | 41.00 |
| methyl ethyl ketone | 41.00 | 40.99 | 46.48 | 41.00 |
| gamma-butrylactone | 10.00 | 10.00 | — | 10.00 |
| dimethyl phthalate | 0.75 | 0.75 | 0.88 | 0.75 |
| dibutyl phthalate | 0.25 | 0.25 | — | 0.25 |
| p-toluene sulfonic acid | — | — | 0.18 | 0.35 |
| Scripset 540 | 3.33 | 2.60 | 3.15 | 3.71 |
| Scripset 550 | 1.17 | — | — | — |
| hydrolyzed Scripset 540 | — | — | 0.67 | — |
| SMA 2625 | — | 2.02 | — | — |
| Above diazo from US 3,849,392 | 1.33 | 1.35 | 0.70 | 2.00 |
| phthalo blue pigment | 1.17 | — | — | — |
| yellow pigment | — | 1.04 | — | — |
| magenta pigment | — | — | 1.44 | — |
| black pigment | — | — | — | 0.94 |
| optical density | 1.1 | 0.9 | 1.2 | 1.5 |
| Typical formulations by weight for the positive-working photosensitive layer include: | | | | |
| diacetone alcohol | — | 11.74 | — | — |
| methyl ethyl ketone | 35.52 | 34.45 | 24.23 | 38.62 |
| gamma butyrolactone | 22.60 | 11.15 | 24.04 | 5.74 |
| Dowanol PM | 34.76 | 35.21 | 44.94 | 48.34 |
| Scripset 540 | 1.60 | 2.01 | 2.15 | 2.39 |
| SMA 2625 | 1.74 | 1.17 | — | 0.60 |
| Butvar B-90 | 0.58 | 0.59 | 0.67 | 0.30 |
| Above diazo from US 4,407,426 | 2.09 | 2.58 | 2.81 | 2.72 |
| phthalo blue pigment | 1.11 | — | — | — |
| yellow pigment | — | 1.08 | — | — |
| magenta pigment | — | — | 1.15 | — |
| black pigment | — | — | — | 1.29 |
| optical density | 1.2 | 1.0 | 1.4 | 1.6 |

Scripset and Butvar resins are from Monsanto, SMA resin is from Arco, and Dowanol PM is propylene glycol monomethyl ether from Dow.

The adhesive layer comprises a major amount of one or more thermoplastic polymers. Suitable polymers nonexclusively include vinyl butyral resins such as Butvar B-79 available from Monsanto; acrylic resins such as Elvacite 2044 available from DuPont; ethylene resins such as Elvax 210; available from Dupont; vinyl chloride resins such as Hostaflex CM 133 available from Hoechst AG; and phenolic resins such as Alnovol PN 429 available from Hoechst AG. The adhesive layer must be partially soluble in the developing medium. Preferably between about 0.1% and 30% of the adhesive layer is removed during development. More preferably between about 0.1% and 10% of the adhesive layer is removed. Generally, thermoplastic polymers suitable for this application are not soluble in the developing medium. Therefore, developing aids must be incorporated into the adhesive layer. Suitable developing aids nonexclusively include acrylic resins with high acid numbers of about 8 or more, such as Carboset 525 available from BF Goodrich; methyl vinyl ether/maleic anhydride copolymers such as Gantrez AN-119 available from GAF; and vinyl pyrrolidone resins such as PVP K-30 also available from GAF. The amount of developing aid is less than 50% of the adhesive layer, preferably less than 30%.

The ingredients for the adhesive layer are generally dissolved in a suitable solvent or solvent mixture which does not change the functional nor colorimetric characteristics of the colored, photosensitive layer. The solutions are then coated directly on the photosensitive layer. It is then dried to a coating weight of from about 3 to about 30 g/m², or more preferably from about 5 to about 20 g/m². The layer may optionally contain a uv absorber such as Uvinul D-50 from GAF. It may also contain a plasticizer such as Resoflex R-296, available from Cambridge Industries. It may also contain antistats, such as Gafac and Gafstat from GAF. The adhesive layer should not be tacky to the touch, during storage or during development of the photosensitive element. The layer should be transferable in the range of from about 60° C. to about 180° C., or preferably 60° C. to 120° C., or more preferably 60° C. to 100° C. when laminated with heat and pressure.

Typical adhesive formulations by weight include:

| I. toluene | 4 |
|---|---|
| n-butyl acetate | 82 |
| Butvar B-79 | 10 |
| Gantrez AN-119 | 14 |
| II. n-butyl acetate | 83 |
| UCAR VYNC | 15 |
| Carboset 525 | 2 |

In operation, the photosensitive element is laminated to a receiver sheet via the adhesive layer. The receiver sheet should be resistant to any adverse effects which may be caused by the developer of choice and laminating procedure. For example, the receiver sheet should be water resistant if aqueous developers are used and dimensionally stable under the elevated temperature and pressure conditions during lamination. Plastic or plastic coated receiver sheets are useful for this purpose.

Useful receiver sheets include Melinex 329, 339, 994 and 3020 available from ICI. Other white and nonwhite receiver sheets may also be used. Rough textured and/or adhesion promoted surfaces are preferred for the receiver.

Lamination may be conducted by putting the receiver sheet in contact with the adhesive side of the colored composite and then introducing the two materials into the nip of a pair of heated laminating rollers under suitable pressure. Suitable laminating temperatures usually range from about 60° C. to about 180° C., preferably about 60° C. to about 120° C. After lamination, the substrate is peeled away, usually merely employing manual peeling forces. The adhesive and photosensitive layers thus remain on the receiver sheet.

The photosensitive layer is imagewise exposed by means well known in the art either before or after lamination. Such exposure may be conducted by exposure to a uv light source through a color separation under vacuum frame conditions. Exposures after lamination and peel apart are preferred for photosensitive-to-emulsion contact. Mercury vapor discharge lamps are preferred over metal halide lamps. Other radiation sources, such as carbon arc, pulsed xenon, and lasers, may also be used. Light absorbing filters may be used to reduce light scattering in the material.

After lamination, substitute removal, and exposure, the photosensitive layer is developed by dissolving the nonimage area in a suitable developer and dried. The adhesive layer is partially removed by this development. A suitable developer nonexclusively includes:

| water | 89.264 |
|---|---|
| monosodium phosphate | 0.269 |
| trisodium phosphate | 2.230 |
| sodium tetradecyl sulfate | 8.237 |

Any developer solutions which satisfactorily removes the nonimage areas of the photosensitive layer after exposure while retaining the image areas may be used. The selection of developer is well within the ability of the skilled artisan.

The process of lamination, substrate separation, exposure, and development can then be repeated whereby another photosensitive element having a different color is laminated to the same receiver sheet over the previously formed image. In the usual case, four colored layers are employed to produce a full color reproduction of a desired image. These are cyan, magenta, yellow and black.

The following nonlimiting examples serve to illustrate the invention.

EXAMPLE 1

Four photosensitive solutions of cyan, yellow, magenta, and black are produced according to the negative-working photosensitive formulations as described above. The pigment is introduced as a dispersion of methyl ethyl ketone, Scripset 540, and the appropriate pigment. The solutions are coated and dried separately to the required optical density onto 3 mil Melinex 516 polyester films as the temporary substrates. The surface densities are roughly 1.3 g/m$^2$ for cyan, 0.9 g/m$^2$ for yellow, 1.8 g/m$^2$ for magenta, and 1.2 g/m$^2$ for black. The adhesive solution, in particular adhesive formulation I as described above, is coated on top of the photosensitive layers and dried to a surface density of 12 g/m$^2$. The yellow composite is then laminated at 90° C. with the adhesive side onto either side of a 7 mil Melinex 3020 polyester receiver sheet. The 516 temporary substrate is peeled away after lamination, leaving the adhesive and photosensitive layers on the receiver sheet. The yellow photosensitive layer is then exposed to actinic light through a photographic separation for the yellow color. The receiver sheet with the exposed yellow layer is then immersed for 15 sec in the developer described above at 27° C. with gentle pad rubbing on the photosensitive side. The nonexposed, yellow areas are thereby washed off and the exposed areas remain during development. If no exposure is given, then all of the photosensitive layer and 6% of the adhesive layer is removed during development. After development, the imaged material is rinsed and then dried. The magenta composite is then laminated as before onto the imaged, yellow side of the receptor sheet. The temporary substrate is removed as before. The magenta layer is then exposed through the magenta separation. It is then processed as with the yellow. The magenta is followed in a like manner by cyan and then by black to give a four color image which is an accurate representation of the original from which the separations are prepared.

The background stain, as measured as the optical density gain in the nonexposed, nonimage areas of the four color proof, is 0.02 for the cyan filter, 0.03 for the yellow filter, 0.02 for the magenta filter, and 0.02 for the visible filter. Samples made without the Gantrez AN-119 in the adhesive have an extremely high background stain of 0.46 for cyan, 0.24 for yellow, 0.33 for magenta, and 0.35 for visible. Values less then 0.05 are generally acceptable for a color proof.

EXAMPLE 2

Four photosensitive solutions of cyan, yellow, magenta, and black are produced according to the positive-working photosensitive formulations described above. The pigment is introduced as a dispersion of methyl ethyl ketone, Scripset 540, and the appropriate pigment. The solutions are coated and dried separately to the required optical density onto 3 mil Melinex 516 polyester films as the temporary substrates. The surface densities are roughly 1.2 g/m$^2$ for cyan, 1.4 g/m$^2$ for yellow, 2.0 g/m$^2$ for magenta, and 1.0 g/m$^2$ for black. The adhesive solution, in particular adhesive formulation II as described above, is coated on top of the photosensitive layers and dried to a surface density of 8 g/m$^2$. The yellow composite is then laminated at 80° C. with the adhesive side onto either side of a 7 mil Melinex 3020 polyester receiver sheet. The 516 temporary substrate is peeled away after lamination, leaving the adhesive and photosensitive layers on the receiver sheet. The yellow photosensitive layer is then exposed to actinic light through a photographic separation for the yellow color. The receiver sheet with the exposed yellow layer is then immersed for 15 sec in the developer described above at 27° C. with gentle pad rubbing on the photosensitive side. The exposed yellow areas are thereby washed off and the nonexposed areas remain during development. If a uniform, blanket exposure is given, all of the photosensitive layer and 14% of the adhesive layer is removed during development. After development, the imaged material is rinsed and then dried. The magenta composite is then laminated as before onto the imaged, yellow side of the receptor sheet. The temporary substrate is removed as before. The magenta layer is then exposed through the magenta separation. It is then processed as with the yellow. The magenta is followed in a like manner by cyan and then by black to give a four color image which is an accurate representation of the original from which the separations are prepared.

The background stain, as measured as the optical density gain in the exposed, nonimage areas of the four color proof, is 0.03 for the cyan filter, 0.03 for the yellow filter, 0.04 for the magenta filter, and 0.03 for the visible. Samples made without the Carboset 525 in the adhesive have a high background stain of 0.14 for cyan, 0.10 for yellow, 0.13 for magenta, and 0.13 for visible.

What is claimed is:

1. A photosensitive element which comprises, in order:
   i) a substrate having a release surface; and
   ii) a single, colored photosensitive layer on said release surface, which photosensitive layer comprises in admixture a light sensitive, negative-working diazonium salt or positive-working naphthoquinone diazide compound in an amount sufficient to photosensitize the layer; a resinous binder composition in an amount sufficient to bind the layer components into a uniform film, which composition contains a major amount of at least one resin selected from the group consisting of a vinyl acetal polymer and a styrene/maleic anhydride copolymer half ester; and at least one colorant in an amount sufficient to uniformly color the layer; and
   iii) a nonphotosensitive adhesive layer in direct contact with said photosensitive layer, which adhesive layer comprises greater than 50 percent of one or more thermoplastic polymers, and one or more developing aids capable of promoting the partial removal of the adhesive layer with a developer, is only partially soluble in a developer, nontacky at room temperature, and can be transferred at temperatures between 60° C. and 180° C.

2. The element of claim 1 wherein said substrate comprises polyethylene terephthalate.

3. The element of claim 1 wherein said substrate has a matte surface.

4. The element of claim 1 wherein said release surface on said substrate comprises polyvinyl alcohol.

5. The element of claim 1 wherein said naphthoquinone diazide in the photosensitive layer comprises the ester of bis-(3-benzoyl-4,5,6-trihydroxy phenyl)-methane and 2-diazo-1-naphthol-5-sulfonic acid.

6. The element of claim 1 wherein said diazonium salt in the photosensitive layer comprises the polycondensation product of 3-methoxy-4-diazo-diphenyl amine sulfate and 4,4'-bis-methoxymethyl-diphenyl ether precipitated as mesitylene sulfonate.

7. The element of claim 1 wherein said photosensitive layer further comprises one or more ingredients selected from the group consisting of plasticizers, stabilizers, antistatic compositions, uv absorbers, surfactants, optical brighteners, and inert fillers.

8. The element of claim 1 wherein the photosensitizer is present in the photosensitive layer in an amount of from about 5 to about 70 percent by weight.

9. The element of claim 1 wherein the colorant is present in the photosensitive layer in an amount of from about 5 to about 50 percent by weight.

10. The element of claim 1 wherein the binding resin is present in the photosensitive layer in an amount of from about 10 to about 80 percent by weight.

11. The element of claim 1 wherein the adhesive layer has a coating weight of from about 3 to about $30 g/m^2$.

12. The element of claim 1 wherein the adhesive layer further comprises one or more ingredients selected from the group consisting of uv absorbers, antistatic compositions, resins, plasticizers, and optical brighteners.

13. The element of claim 11 wherein the adhesive layer comprises one or more thermoplastic polymers selected from the group consisting of vinyl chloride, vinyl butyral, acrylic, ethylene, and phenolic resins.

* * * * *